(12) United States Patent
Kang et al.

(10) Patent No.: US 11,362,104 B2
(45) Date of Patent: Jun. 14, 2022

(54) SEMICONDUCTOR MEMORY DEVICE

(71) Applicant: SK hynix Inc., Icheon-si (KR)

(72) Inventors: Byung Woo Kang, Icheon-si (KR); Min Sung Ko, Icheon-si (KR); Gwang Been Kim, Icheon-si (KR); Hwal Pyo Kim, Icheon-si (KR); Jin Taek Park, Icheon-si (KR); Young Ock Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 29 days.

(21) Appl. No.: 16/916,989

(22) Filed: Jun. 30, 2020

(65) Prior Publication Data
US 2021/0134823 A1 May 6, 2021

(30) Foreign Application Priority Data
Nov. 5, 2019 (KR) .................. 10-2019-0140451

(51) Int. Cl.
| | | |
|---|---|---|
| *H01L 27/1157* | (2017.01) | |
| *H01L 23/48* | (2006.01) | |
| *H01L 27/11573* | (2017.01) | |
| *H01L 27/11565* | (2017.01) | |

(52) U.S. Cl.
CPC ...... *H01L 27/11573* (2013.01); *H01L 23/481* (2013.01); *H01L 27/1157* (2013.01); *H01L 27/11565* (2013.01)

(58) Field of Classification Search
CPC ............. H01L 27/11573; H01L 23/481; H01L 27/1157; H01L 27/11565; H01L 27/11575; H01L 27/11582; H01L 27/11524; H01L 27/11551; H01L 27/11578; H01L 21/76897; H01L 21/76895
See application file for complete search history.

(56) References Cited

U.S. PATENT DOCUMENTS

| | | | |
|---|---|---|---|
| 9,530,790 B1* | 12/2016 | Lu ...................... | H01L 27/11575 |
| 9,812,464 B1* | 11/2017 | Hwang ............... | H01L 27/1157 |
| 2010/0155826 A1* | 6/2010 | Wenxu .............. | H01L 27/11578 257/326 |
| 2013/0161821 A1* | 6/2013 | Hwang ............. | H01L 27/11556 257/773 |
| 2015/0294977 A1* | 10/2015 | Kim .................. | H01L 27/11582 257/314 |
| 2016/0225785 A1* | 8/2016 | Kim .................. | H01L 27/11575 |
| 2017/0040337 A1* | 2/2017 | Kim .................. | H01L 27/11582 |

(Continued)

FOREIGN PATENT DOCUMENTS

| | | | |
|---|---|---|---|
| KR | 1020150029103 A | 3/2015 | |
| KR | 1020170052851 A | 5/2017 | |

*Primary Examiner* — Shahed Ahmed
*Assistant Examiner* — Khatib A Rahman
(74) *Attorney, Agent, or Firm* — William Park & Associates Ltd.

(57) ABSTRACT

A semiconductor memory device includes a substrate including a peripheral circuit, a stepped dummy stack overlapping the substrate and including a plurality of steps extending in a first direction, a plurality of contact groups passing through the stepped dummy stack, and upper lines respectively connected to the contact groups. The contact groups include a first contact group having two or more first contact plugs arranged in the first direction. The upper lines include a first upper line commonly connected to the first contact plugs.

21 Claims, 20 Drawing Sheets

(56) References Cited

U.S. PATENT DOCUMENTS

| | | | |
|---|---|---|---|
| 2017/0148748 A1* | 5/2017 | Jeong | H01L 27/11524 |
| 2017/0170191 A1* | 6/2017 | Lee | H01L 27/11582 |
| 2017/0200676 A1* | 7/2017 | Jeong | H01L 27/11556 |
| 2017/0213845 A1* | 7/2017 | Baba | H01L 27/11575 |
| 2017/0263638 A1* | 9/2017 | Okada | H01L 27/1157 |
| 2017/0338241 A1* | 11/2017 | Lee | H01L 29/66833 |
| 2018/0247953 A1* | 8/2018 | Lee | H01L 27/11551 |
| 2018/0301372 A1* | 10/2018 | Noh | H01L 21/76877 |
| 2018/0350831 A1* | 12/2018 | Kim | H01L 27/1157 |
| 2019/0319038 A1* | 10/2019 | Zhang | H01L 23/535 |
| 2019/0333923 A1* | 10/2019 | Kim | H01L 27/11556 |
| 2019/0378857 A1* | 12/2019 | Lee | H01L 27/11521 |

* cited by examiner

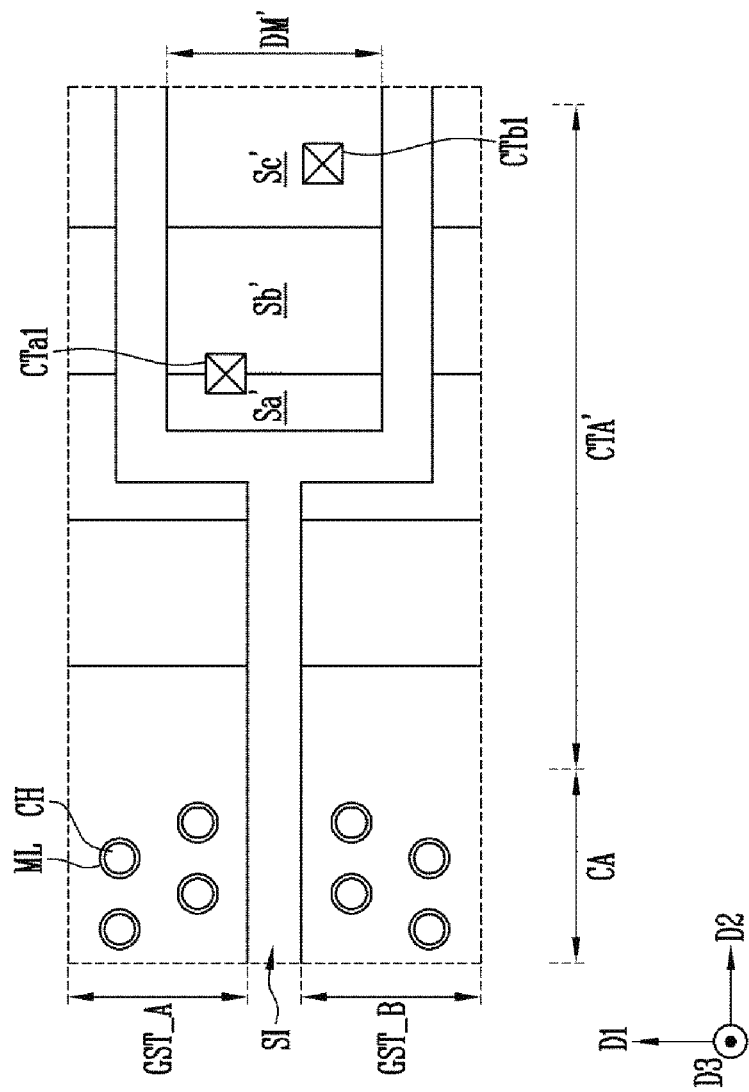

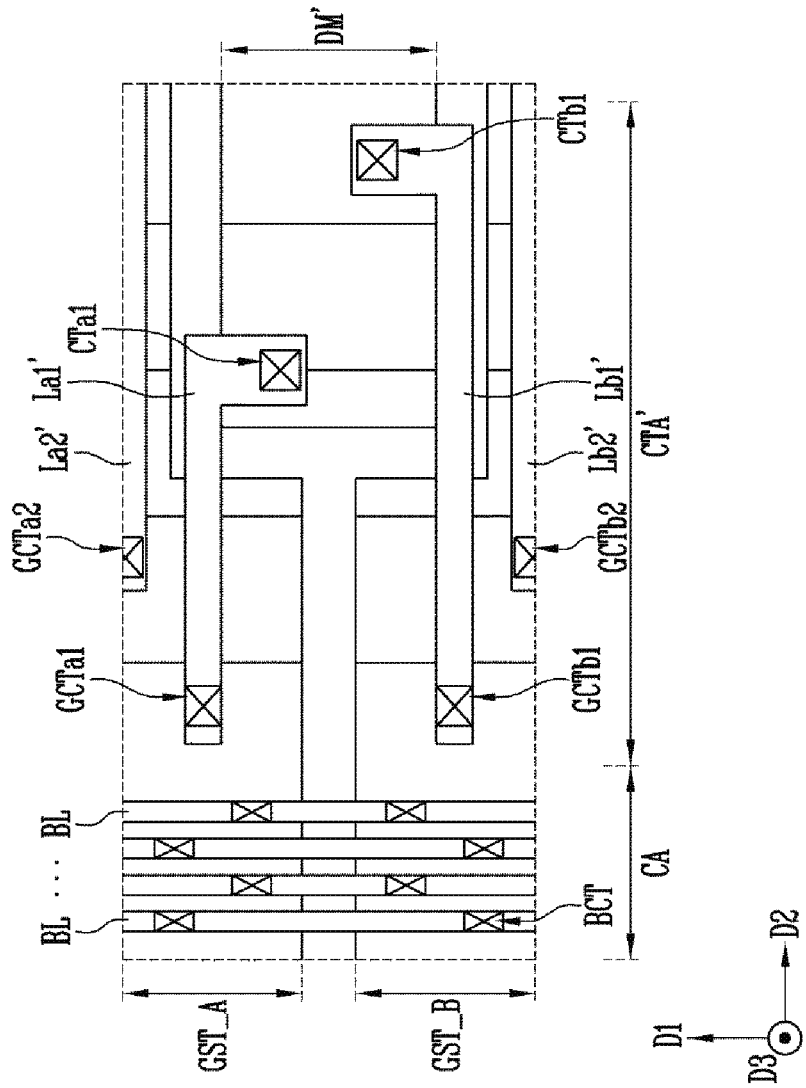

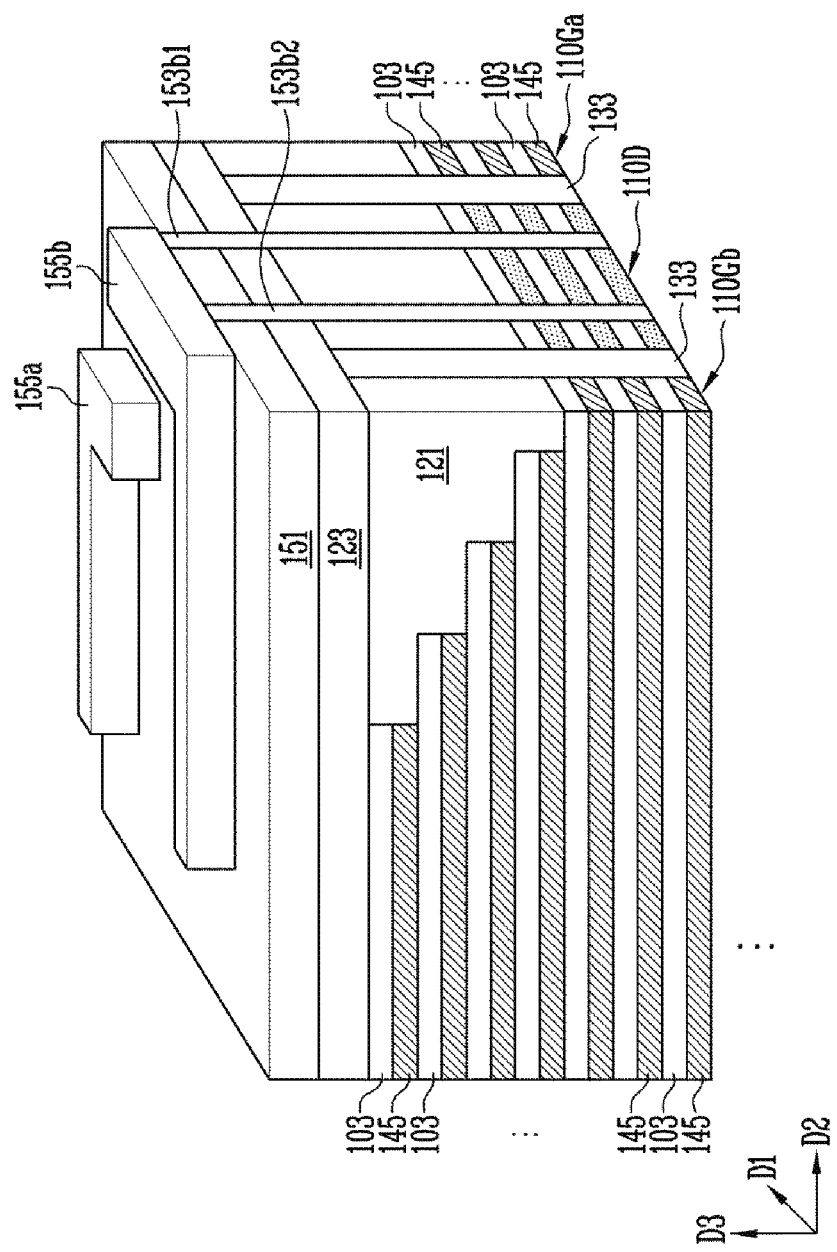

US 11,362,104 B2

SEMICONDUCTOR MEMORY DEVICE

CROSS-REFERENCE TO RELATED APPLICATION

The present application claims priority under 35 U.S.C. § 119(a) to Korean patent application number 10-2019-0140451, filed on Nov. 5, 2019, in the Korean Intellectual Property Office, the entire disclosure of which is incorporated herein by reference.

BACKGROUND

1. Technical Field

The present disclosure relates to a semiconductor memory device, and more particularly, to a semiconductor memory device including a stack overlapping a peripheral circuit.

2. Related Art

A semiconductor memory device includes a memory cell array and a peripheral circuit connected to the memory cell array. The memory cell array includes a plurality of memory cells capable of storing data, and the peripheral circuit is configured to perform various operations of the memory cells.

In order to improve a degree of integration of a semiconductor memory device, the memory cell array may overlap the peripheral circuit. In forming such a structure, various process defects may occur.

SUMMARY

A semiconductor memory device according to an embodiment of the present disclosure may include a substrate including a peripheral circuit, a stepped dummy stack overlapping the substrate and including a plurality of steps extending in a first direction, a plurality of contact groups passing through the stepped dummy stack, and upper lines respectively connected to the contact groups. The contact groups may include a first contact group having two or more first contact plugs arranged in the first direction. The upper lines may include a first upper line commonly connected to the first contact plugs.

A semiconductor memory device according to an embodiment of the present disclosure may include a substrate including a peripheral circuit; a stepped dummy stack overlapping the substrate and including a plurality of steps extending in a first direction; a first contact plug and a second contact plug that pass through the stepped dummy stack and are adjacent to each other in a diagonal direction with respect to the first direction, in a plane parallel to the steps; a first upper line connected to the first contact plug; and a second upper line connected to the second contact plug and spaced apart from the first upper line.

A semiconductor memory device according to an embodiment of the present disclosure may include a substrate including a peripheral circuit; a first gate stack overlapping the substrate, a second gate stack overlapping the substrate and substantially parallel to the first gate stack; a stepped dummy stack disposed between the first gate stack and the second gate stack and including a plurality of steps extending in a first direction; a plurality of contact groups overlapping steps of the plurality of steps that are different from each other, and extending to pass through the stepped dummy stack; a first gate contact plug connected to the first gate stack; a second gate contact plug connected to the second gate stack; a first upper line connecting a first contact group among the contact groups and the first gate contact plug to each other; and a second upper line connecting a second contact group among the contact groups and the second gate contact plug to each other.

BRIEF DESCRIPTION OF THE DRAWINGS

FIGS. 7A and 7B are plan views illustrating the semiconductor memory device according to an embodiment.

FIGS. 10A, 10B, 10C, 10D, and 10E are perspective views illustrating the method of manufacturing the semiconductor memory device according to an embodiment.

DETAILED DESCRIPTION

Specific structural or functional descriptions disclosed herein are merely illustrative for the purpose of describing embodiments according to the concept of the present disclosure. The embodiments may be implemented in various forms, and should not be construed as being limited to the specific embodiments set forth herein.

An embodiment of the present disclosure provides a semiconductor memory device capable of improving yield reduction of a semiconductor memory device due to a process defect.

Figure 1:
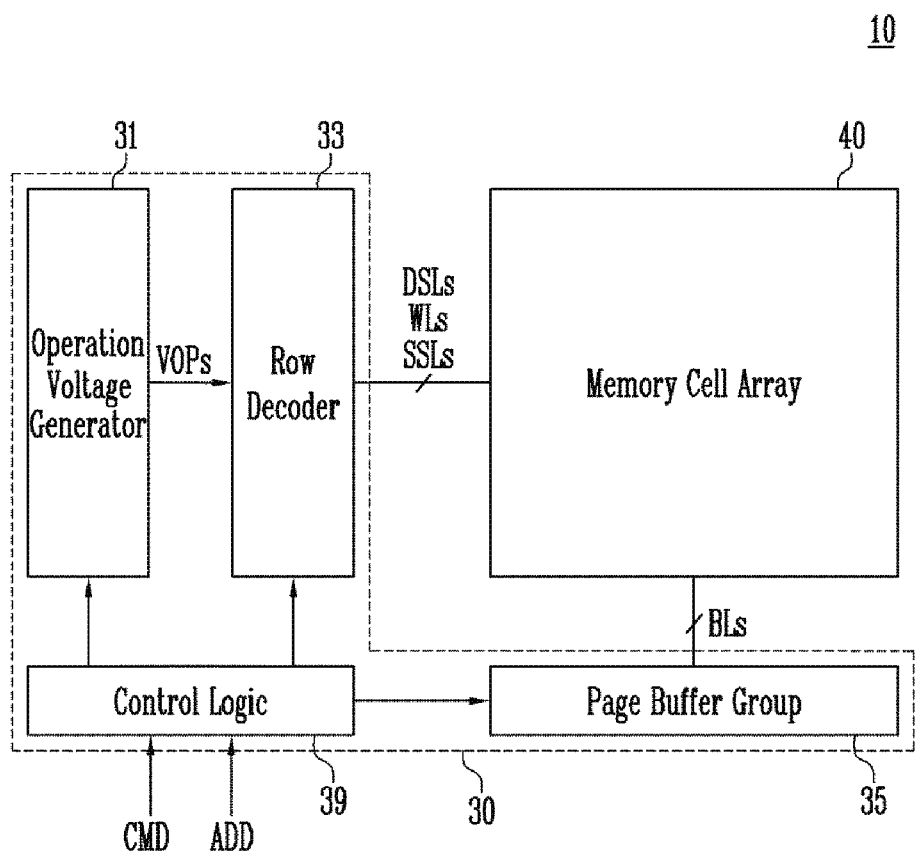
FIG. 1 is a block diagram illustrating a semiconductor memory device according to an embodiment.

FIG. 1 is a block diagram illustrating a semiconductor memory device 10 according to an embodiment.

Referring to FIG. 1, the semiconductor memory device 10 includes a peripheral circuit 30 and a memory cell array 40.

The peripheral circuit 30 may perform a program operation of storing data in the memory cell array 40, a read operation of outputting data stored in the memory cell array 40, and an erase operation of erasing data stored in the memory cell array 40. In an embodiment, the peripheral circuit 30 may include control logic 39, an operation voltage generator 31, a row decoder 33, and a page buffer group 35.

The memory cell array 40 may include a plurality of memory blocks. Each of the memory blocks may be connected to one or more drain select lines DSLs, a plurality of word lines WLs, one or more source select lines SSLs, and a plurality of bit lines BLs.

The control logic 39 may control the peripheral circuit 30 in response to a command CMD and an address ADD.

The operation voltage generator 31 may generate various operation voltages VOPs used for the program operation, the read operation, and the erase operation in response to control of the control logic 39. The operation voltages VOPs may include a program voltage, a verification voltage, a pass voltage, a select line voltage, and the like.

The row decoder 33 may select a memory block in response to the control of the control logic 39. The row decoder 33 may apply operation voltages VOPs to the drain select lines DSLs, the word lines WLs, and the source select lines SSLs connected to the selected memory block.

The page buffer group 35 may be connected to the memory cell array 40 through the bit lines BLs. The page buffer group 35 may temporarily store data received from an input/output circuit (not shown) during the program operation in response to control of the control logic 39. The page buffer group 35 may sense a voltage or a current of the bit lines BLs during the read operation or the verification operation in response to the control of the control logic 39.

Figure 2:
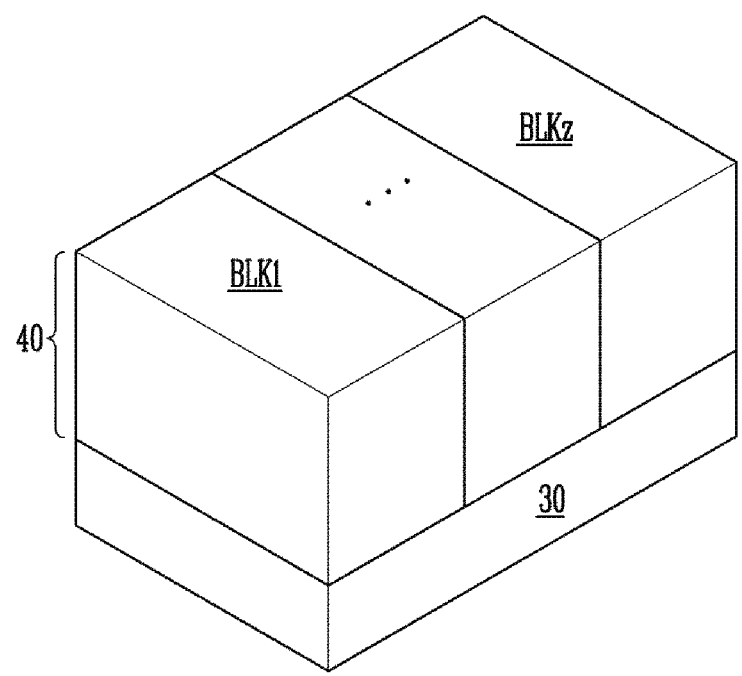
FIG. 2 is a diagram schematically illustrating a disposition of a peripheral circuit and a memory cell array shown in FIG. 1.

FIG. 2 is a diagram schematically illustrating a disposition of the peripheral circuit 30 and the memory cell array 40 shown in FIG. 1.

Referring to FIG. 2, the memory cell array 40 may overlap the peripheral circuit 30. Although not shown in the drawing, the peripheral circuit 30 and the memory cell array 40 may be disposed on a substrate. The substrate may include a first area overlapping the memory cell array 40, and a second area extending laterally from the first area. In an embodiment, the substrate SUB may include a peripheral circuit 30. In an embodiment, the memory cell array 40 may be on a lower structure including a substrate SUB and a peripheral circuit 30, the peripheral circuit 30 may be located between the substrate and the memory cell array 40. In an embodiment, the peripheral circuit 30 may be coupled to contact plugs.

The memory cell array 40 may include a plurality of memory blocks BLK1 to BLKz. Each of the memory blocks BLK1 to BLKz may include a plurality of memory cell strings.

Figure 3A:
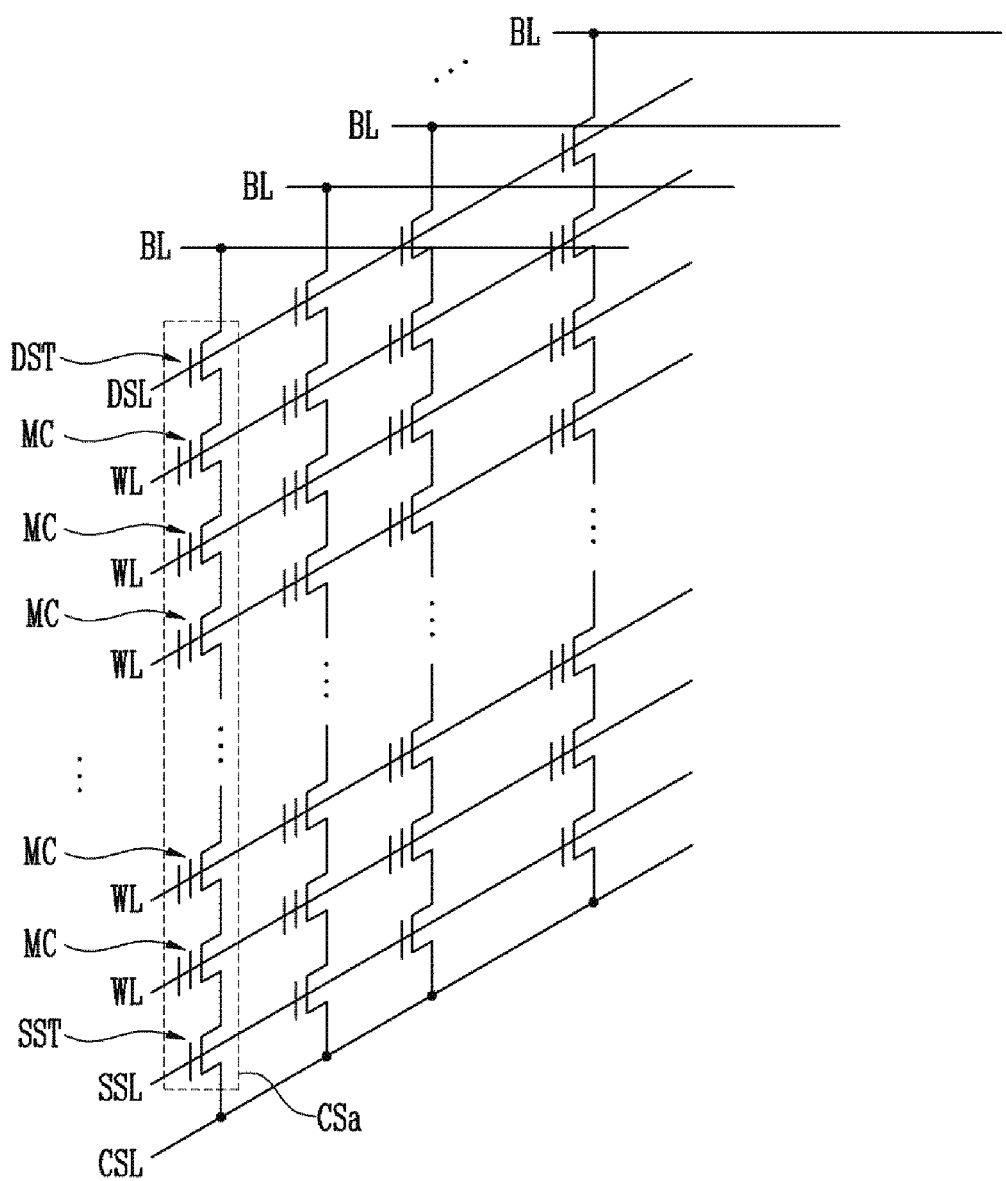
FIGS. 3A and 3B are circuit diagrams illustrating memory cell strings according to various embodiments.
Figure 3B:
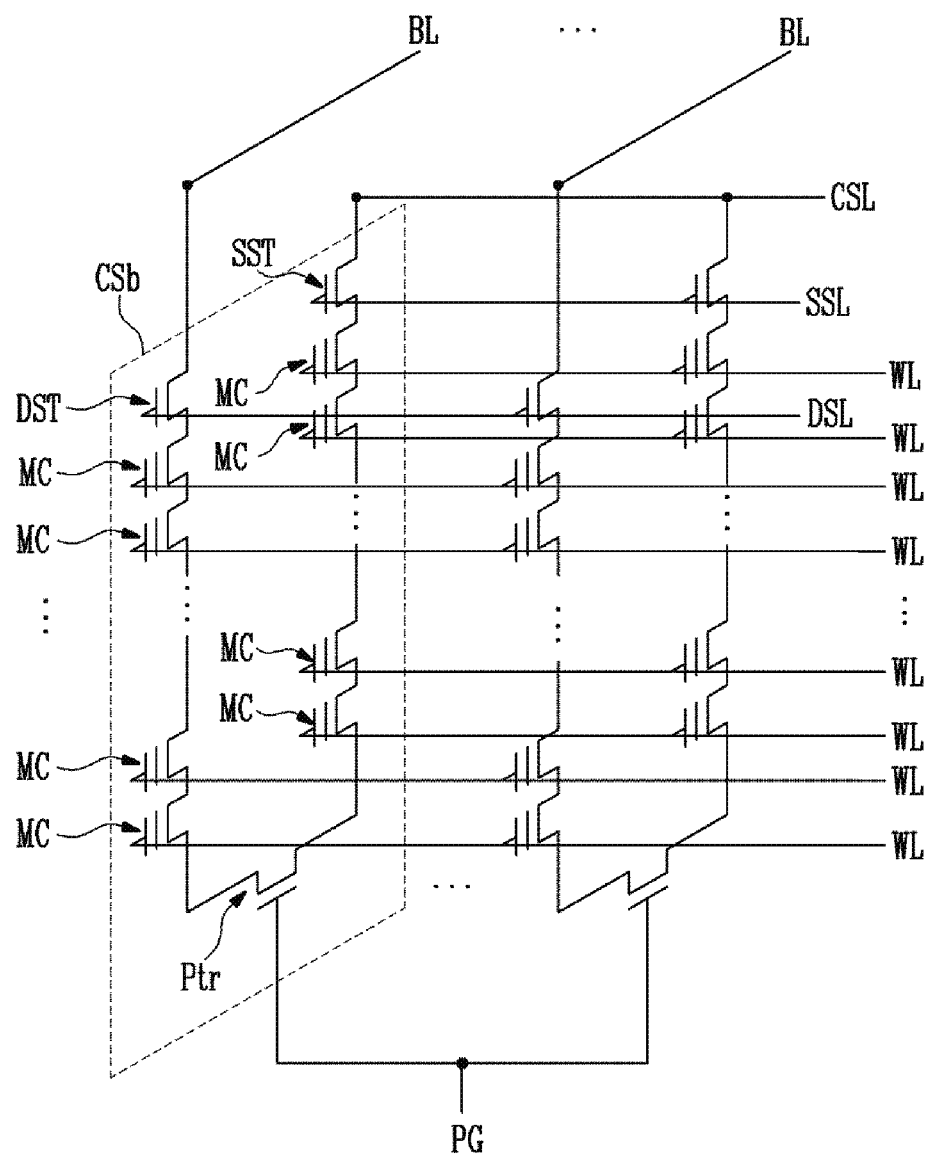

FIGS. 3A and 3B are circuit diagrams illustrating memory cell strings CSa and CSb according to various embodiments.

Referring to FIGS. 3A and 3B, each of the memory cell strings CSa and CSb may be connected to corresponding one of the bit lines BL and a common source line CSL. Each of the memory cell strings CSa and CSb may be connected to the common source line CSL under control of a source select transistor SST, and may be connected to the corresponding bit line BL under control of a drain select transistor DST.

Each of the memory cell strings CSa and CSb may include a plurality of memory cells MC connected in series between the source select transistor SST and the drain select transistor DST. One source select transistor SST may be disposed, or two or more source select transistors SST connected in series may be disposed, between the common source line CSL and the plurality of memory cells MC. One drain select transistor DST may be disposed, or two or more drain select transistors DST connected in series may be disposed, between the bit line BL and the plurality of memory cells MC.

The plurality of memory cells MC may be connected to the word lines WL, respectively. An operation of the plurality of memory cells MC may be controlled by cell gate signals applied to the word lines WL. The source select transistor SST may be connected to the source select line SSL. An operation of the source select transistor SST may be controlled by a source select gate signal applied to the source select line SSL. The drain select transistor DST may be connected to the drain select line DSL. An operation of the drain select transistor DST may be controlled by a drain select gate signal applied to the drain select line DSL.

Referring to FIG. 3A, the memory cells MC of the memory cell string CSa may be stacked in one column between the corresponding bit line BL and the common source line CSL.

Referring to FIG. 3B, the memory cells MC of the memory cell string CSb may be divided into a first column stacked between a pipe gate PG and the bit line BL, and a second column stacked between the pipe gate PG and the common source line CSL. The memory cells of the first column and the memory cells of the second column may be connected to each other by a pipe transistor Ptr operating under control of the pipe gate PG.

The source select line SSL, the word lines WL, and the drain select line DSL shown in FIGS. 3A and 3B may be implemented through a gate stack.

Figure 4A:
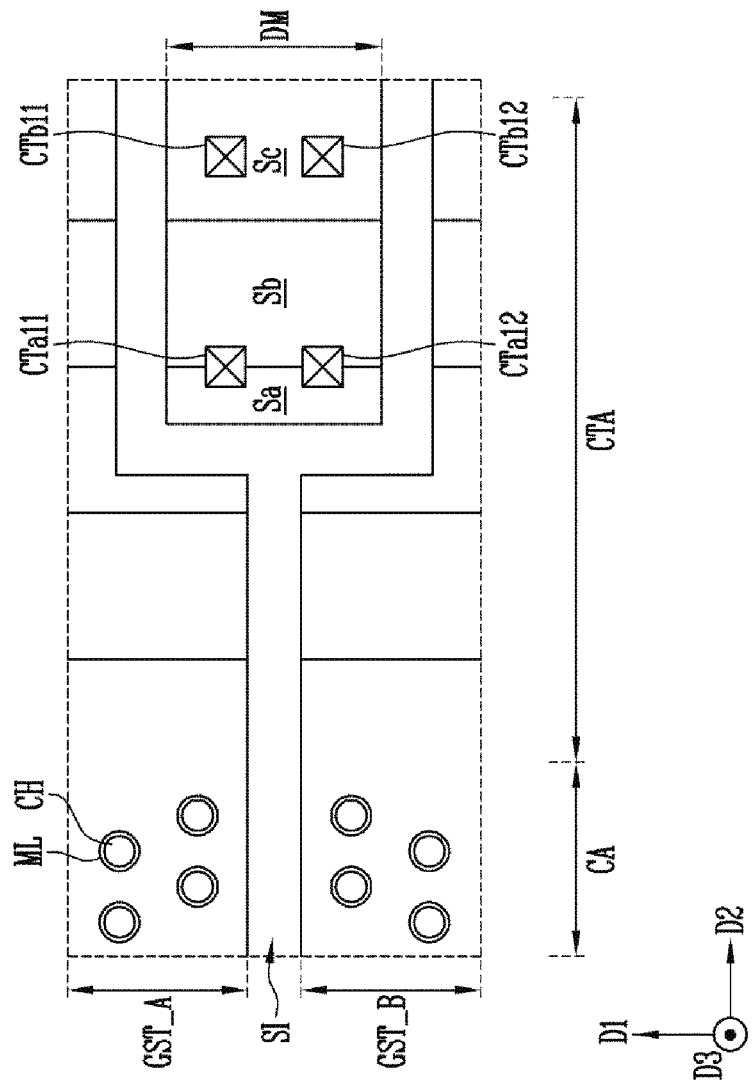
FIGS. 4A and 4B are plan views illustrating the semiconductor memory device according to an embodiment.
Figure 4B:
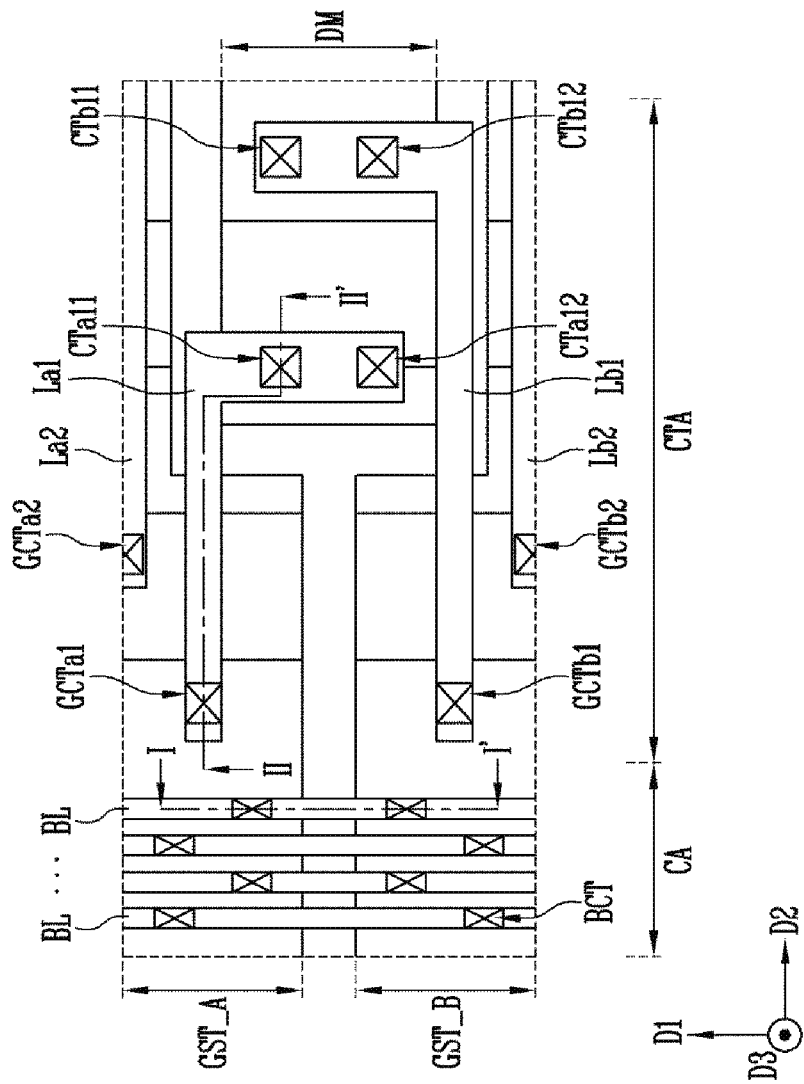

FIGS. 4A and 4B are plan views illustrating the semiconductor memory device according to an embodiment. FIG. 4A is a plan view illustrating a layout of first and second gate stacks GST_A and GST_B and a dummy stack DM, and FIG. 4B is a plan view illustrating a layout of the bit line BL and upper lines La1, La2, Lb1, and Lb2.

Referring to FIGS. 4A and 4B, the semiconductor memory device may include a cell area CA and a contact area CTA.

The cell area CA is an area in which a plurality of memory cell strings are disposed. Each of the memory cell strings may be implemented as the memory cell string CSa shown in FIG. 3A or the memory cell string CSb shown in FIG. 3B.

Referring to FIG. 4A, the first gate stack GST_A and the second gate stack GST_B may be disposed to be substantially parallel with each other. Each of the first gate stack GST_A and the second gate stack GST_B may extend along a first direction D1 and a second direction D2. The first direction D1 and the second direction D2 may be parallel to an X-axis and a Y-axis intersecting each other in an XYZ coordinate system. Each of the first gate stack GST_A and the second gate stack GST_B may include conductive patterns. The conductive patterns may be used as the word lines WL, the drain select line DSL, and the source select line SSL described with reference to FIGS. 3A and 3B. The conductive patterns included in each of the first gate stack GST_A and the second gate stack GST_B may be connected to a memory cell string corresponding to the conductive patterns, and may be stacked to be spaced apart from each other in a third direction D3. The third direction D3 may be parallel to a Z axis orthogonal to an XY plane in the XYZ coordinate system.

A plurality of channel structures CH may pass through each of the first gate stack GST_A and the second gate stack GST_B. The channel structures CH are disposed in the cell area CA. Each of the channel structures CH may be used as a channel region of the memory cell string. Each of the channel structures CH may be surrounded by a memory film ML. The memory film ML may be used as a data storage area of a memory cell corresponding to the memory film ML.

The channel structures CH may be connected to the bit lines BL through bit line contact plugs BCT as shown in FIG. 4B. One of the channel structures CH passing through the first gate stack GST_A shown in FIG. 4A and one of the channel structures CH passing through the second gate stack GST_B shown in FIG. 4A may be commonly connected to corresponding one of bit line among the bit lines BL shown in FIG. 4B.

Referring to FIGS. 4A and 4B, each of the first gate stack GST_A and the second gate stack GST_B may be formed in a stepped structure in the contact area CTA. The contact area CTA is an area in which connection structures for connecting the memory cell strings and the peripheral circuit 30 described with reference to FIG. 2 to each other are disposed. The connection structures may include gate contact plugs GCTa1, GCTa2, GCTb1, and GCTb2, contact plugs CTa11, CTa12, CTb11, and CTb12, and upper lines La1, La2, Lb1, and Lb2.

The first gate stack GST_A and the second gate stack GST_B may be connected to the gate contact plugs GCTa1, GCTa2, GCTb1, and GCTb2 through the stepped structure. The gate contact plugs GCTa1, GCTa2, GCTb1, and GCTb2 may be divided into first gate contact plugs GCTa1 and GCTa2 connected to the first gate stack GST_A and second gate contact plugs GCTb1 and GCTb2 connected to the second gate stack GST_B.

The dummy stack DM may overlap the peripheral circuit 30 described with reference to FIG. 2, in the contact area CTA. The dummy stack DM may be disposed adjacent to the first gate stack GST_A and the second gate stack GST_B. In an embodiment, the dummy stack DM may be disposed between the first gate stack GST_A and the second gate stack GST_B. The present disclosure is not limited thereto, and a position of the dummy stack DM may be variously changed according to design of the semiconductor memory device.

The contact plugs CTa11, CTa12, CTb11, and CTb12 may pass through the dummy stack DM. The contact plugs CTa11, CTa12, CTb11, and CTb12 may extend toward the peripheral circuit 30 shown in FIG. 2. The contact plugs CTa11, CTa12, CTb11, and CTb12 may be divided into a plurality of contact groups. The contact groups may be connected to the first and second gate contact plugs GCTa1, GCTa2, GCTb1, and GCTb2, respectively, through the upper lines La1, La2, Lb1, and Lb2. The contact plugs included in the same contact group may be electrically connected to corresponding one gate contact plug through corresponding one upper line. FIGS. 4A and 4B show a first contact group corresponding to the first gate contact plugs GCTa1 and a second contact group corresponding to the second gate contact plugs GCTb1.

The dummy stack DM may be formed in a stepped structure including a plurality of steps. Each of the contact groups may include two or more contact plugs arranged along a direction in which a corresponding step extends. In an embodiment, the dummy stack DM may include steps Sa to Sc each extending in the first direction D1. The first contact group may include first contact plugs CTa11 and CTa12 arranged in the first direction D1, and the second contact group may include second contact plugs CTb11 and CTb12 arranged in the first direction D1.

The contact groups may overlap different steps. For example, the first contact plugs CTa11 and CTa12 of the first contact group may overlap a boundary between the step Sa and the step Sb adjacent to each other, and the second contact plugs CTb11 and CTb12 of the second contact group may overlap the step Sc. In an embodiment, the second contact plugs CTb11 and CTb12 may be spaced apart from sidewalls of the steps Sa to Sc.

The upper lines La1, La2, Lb1, and Lb2 may be spaced apart from each other. The upper lines La1, La2, Lb1, and Lb2 may be divided into first upper lines La1 and La2 respectively connected to the first gate contact plugs CTa11 and CTa12, and second upper lines Lb1 and Lb2 respectively connected to the second gate contact plugs CTb11 and CTb12. Each of the first upper lines La1 and La2 may be extended to overlap the first gate stack GST_A and the dummy stack DM. Each of the second upper lines Lb1 and Lb2 may be extended to overlap the second gate stack GST_B and the dummy stack DM.

Each of the upper lines La1, La2, Lb1, and Lb2 may be commonly connected to contact plugs included in a corresponding contact group. For example, the first contact plugs CTa11 and CTa12 of the first contact group may be commonly connected to the first upper line La1, and the second contact plugs CTb11 and CTb12 of the second contact group may be commonly connected to the second upper line Lb1.

The first gate stack GST_A, the second gate stack GST_B, and the dummy stack DM may be spaced apart from each other through a slit SI. The slit SI may be extended to surround the dummy stack DM in the contact area CTA.

Figure 5A:
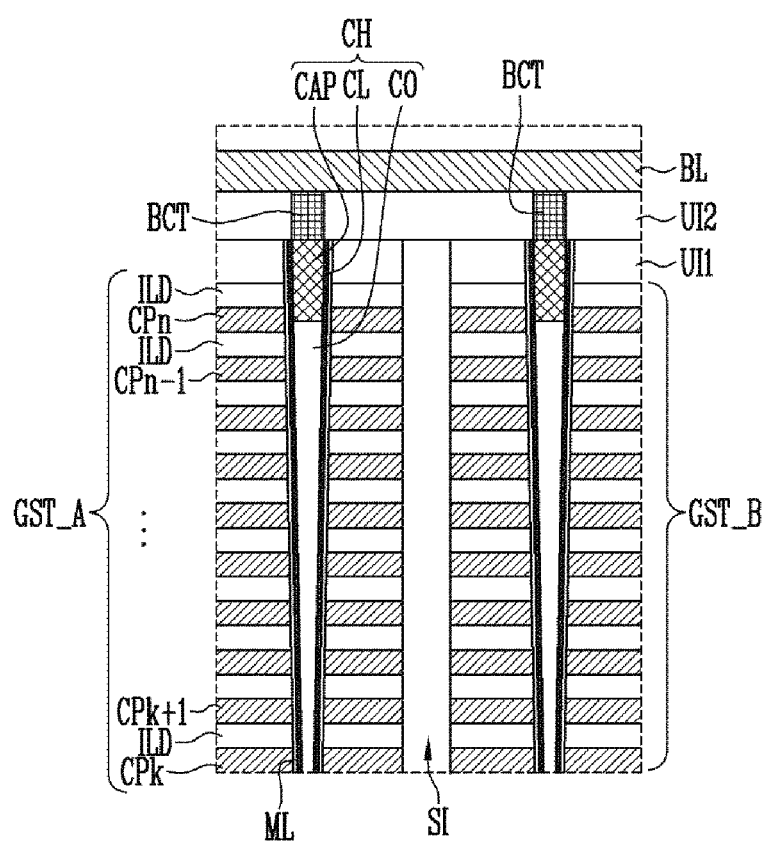
FIGS. 5A and 5B illustrate cross-sectional views taken along a line I-I' and a line II-II' shown in FIG. 4B, respectively.
Figure 5B:
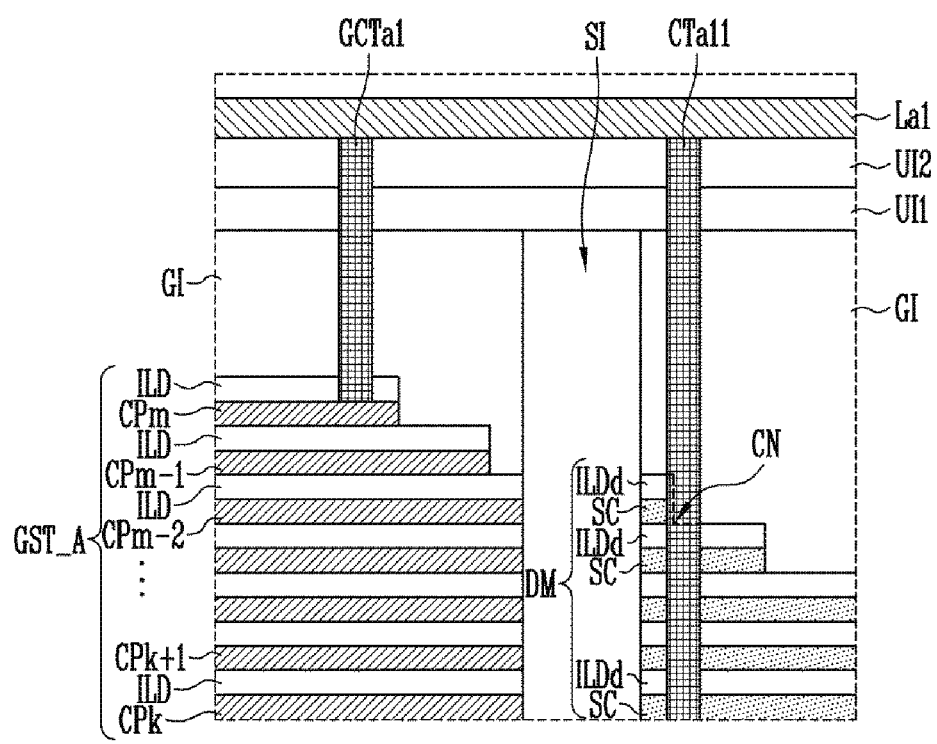

FIGS. 5A and 5B illustrate cross-sectional views taken along a line I-I' and a line II-II' shown in FIG. 4B, respectively.

Referring to FIG. 5A, each of the first and second gate stacks GST_A and GST_B may include alternately stacked interlayer insulating films ILD and conductive patterns CPk to CPn (k is a natural number and n is a natural number greater than k). Although not shown in the drawing, each of the first and second gate stacks GST_A and GST_B further includes alternately stacked lower conductive patterns and lower interlayer insulating films under the interlayer insulating films ILD and the conductive patterns CPk to CPn. The slit SI may separate the conductive patterns CPk to CPn and the lower conductive patterns (not shown) of the first gate stack GST_A from the conductive patterns CPk to CPn and the lower conductive patterns (not shown) of the second gate stack GST_B.

In an embodiment, the conductive patterns CPk to CPn of the first and second gate stacks GST_A and GST_B may be used as the word lines WL and the drain select line DSL described with reference to FIG. 3A. The source select line SSL shown in FIG. 3A may be implemented by any one of lower conductive patterns that are not shown. In an embodiment, the conductive patterns CPk to CPn of the first gate stack GST_A may be used as the word lines WL and the drain select line DSL described with reference to FIG. 3B, and the conductive patterns CPk to CPn of the second gate stack GST_B may be used as the word lines WL and the source select line SSL described with reference to FIG. 3B.

The interlayer insulating films ILD and the conductive patterns CPk to CPn may surround the corresponding channel structure CH in the cell area. The channel structure CH may include a core insulating film CO and a capping pattern CAP disposed in a center area of the channel structure CH, and a channel film CL extending along a surface of the capping pattern CAP and the core insulating film CO. The channel film CL may be formed of a semiconductor film such as silicon. The capping pattern CAP may be formed of a doped semiconductor film. Although not shown in the drawing, in an embodiment, the core insulating film CO may be omitted, and the channel film CL may be formed to fill the center area of the channel structure CH.

The channel structure CH may be surrounded by the memory film ML. The memory film ML may include a tunnel insulating film, a data storage film, and a blocking insulating film sequentially stacked from the sidewalls of the channel structure CH toward the corresponding gate stack GST_A or GST_B. The data storage film may be formed of a material film capable of storing changed data using Fowler-Nordheim tunneling. To this end, the data storage film may be formed of various materials. In an embodiment, the data storage film may be formed of a nitride film capable of charge trapping. The present disclosure is not limited thereto, and the data storage film may include silicon, a phase change material, nano-dot, and the like. The blocking insulating film may include an oxide film capable of blocking a charge. The tunnel insulating film may be formed of a silicon oxide film capable of charge tunneling.

The first and second gate stacks GST_A and GST_B may be covered with a first upper insulating film UI1, and the channel structure CH and the memory film ML may be extended to pass through the first upper insulating film UI1. The first upper insulating film UI1 may be covered with a second upper insulating film UI2.

The bit line contact plug BCT may pass through the second upper insulating film UI2 and be connected to the channel structure CH. The bit line BL may be connected to the bit line contact plug BCT and may be extended to overlap the second upper insulating film UI2.

Referring to FIG. 5B, the conductive patterns CPk to CPn shown in FIG. 5A may extend to the contact area and form a stepped structure. FIG. 5B shows conductive patterns CPm−2 to CPm (m is a natural number satisfying k<m<n) included in a portion of the stepped structure, but the present disclosure is not limited thereto. In an embodiment, the stepped structure of each of the first gate stack GST_A and the second gate stack GST_B shown in FIG. 4A may be defined as the conductive patterns CPk to CPn and the lower conductive patterns are etched to form each of the steps of the stepped structure.

The dummy stack DM may include dummy interlayer insulating films ILDd and sacrificial films SC separated from the interlayer insulating films ILD and the conductive patterns CPk to CPn through the slit SI. The dummy interlayer insulating films ILDd and the sacrificial films SC may be alternately stacked and form a stepped structure.

The dummy interlayer insulating films ILDd may be formed of the same material as the interlayer insulating films ILD, and the sacrificial films SC may be formed of a material having an etch rate different from that of the interlayer insulating films ILD. In an embodiment, each of the dummy interlayer insulating films ILDd may be formed of an oxide film, and each of the sacrificial films SC may be formed of a nitride film.

Each of the stepped structure defined by the conductive patterns CPk to CPm and the interlayer insulating films ILD and the stepped structure of the dummy stack DM may be covered with a gap fill insulating film GI. The gap fill insulating film GI may alleviate a step difference due to the stepped structures. The first and second upper insulating films UI1 and UI2 described above with reference to FIG. 5A may be extended to overlap the gap fill insulating film GI.

Each of the dummy stack DM, the gap fill insulating film GI, and the first and second upper insulating films UI1 and UI2 may be passed through by the contact plugs CTa11, CTa12, CTb11, and CTb12 divided into the plurality of contact groups as described with reference to FIGS. 4A and 4B. Some of the contact plugs CTa11, CTa12, CTb11, and CTb12 may pass through a corner CN defined at the boundary between the steps forming the stepped structure of the dummy stack DM. In an embodiment, the first contact plugs CTa11 and CTa12 shown in FIGS. 4A and 4B may pass through the corner CN defined at the boundary between the steps.

In a process of manufacturing the semiconductor memory device, a void or a seam may be generated at the corner CN defined at the boundary between the steps. Therefore, a void or a seam may be generated inside the first contact plugs CTa11 and CTa12 shown in FIGS. 4A and 4B along the corner CN. According to an embodiment of the present disclosure, the contact plugs of each contact group, which are arranged along a direction in which the steps extend, are connected to the same upper line. Accordingly, operation reliability of the semiconductor memory device may be secured even though a bridge phenomenon occurs in which the contact plugs of each contact group, which are arranged along the direction in which the steps extend, are connected to each other due to the void or the seam.

Each of the first upper lines La1 and La2 and the second upper lines Lb1 and Lb2 shown in FIG. 4B may be disposed on the second upper insulating film UI2, and may be connected to the contact plugs of the corresponding contact group. In an embodiment, the first upper line La1 may be connected to the first contact plug CTa11 of the first contact group, and may be extended to overlap the second upper insulating film UI2 and the first gate contact plug GCTa1.

Each of the first gate contact plugs GCTa1 and GCTa2 and the second gate contact plugs GCTb1 and GCTb2 shown in FIG. 4B may connect corresponding one conductive pattern and corresponding one upper line to each other. In an embodiment, the first gate contact plug GCTa1 may pass through the first and second upper insulating films UI1 and UI2 and the gap fill insulating film GI to connect the conductive pattern CPm among the conductive patterns of the first gate stack GST_A and the first upper line La1 to each other.

Figure 6:
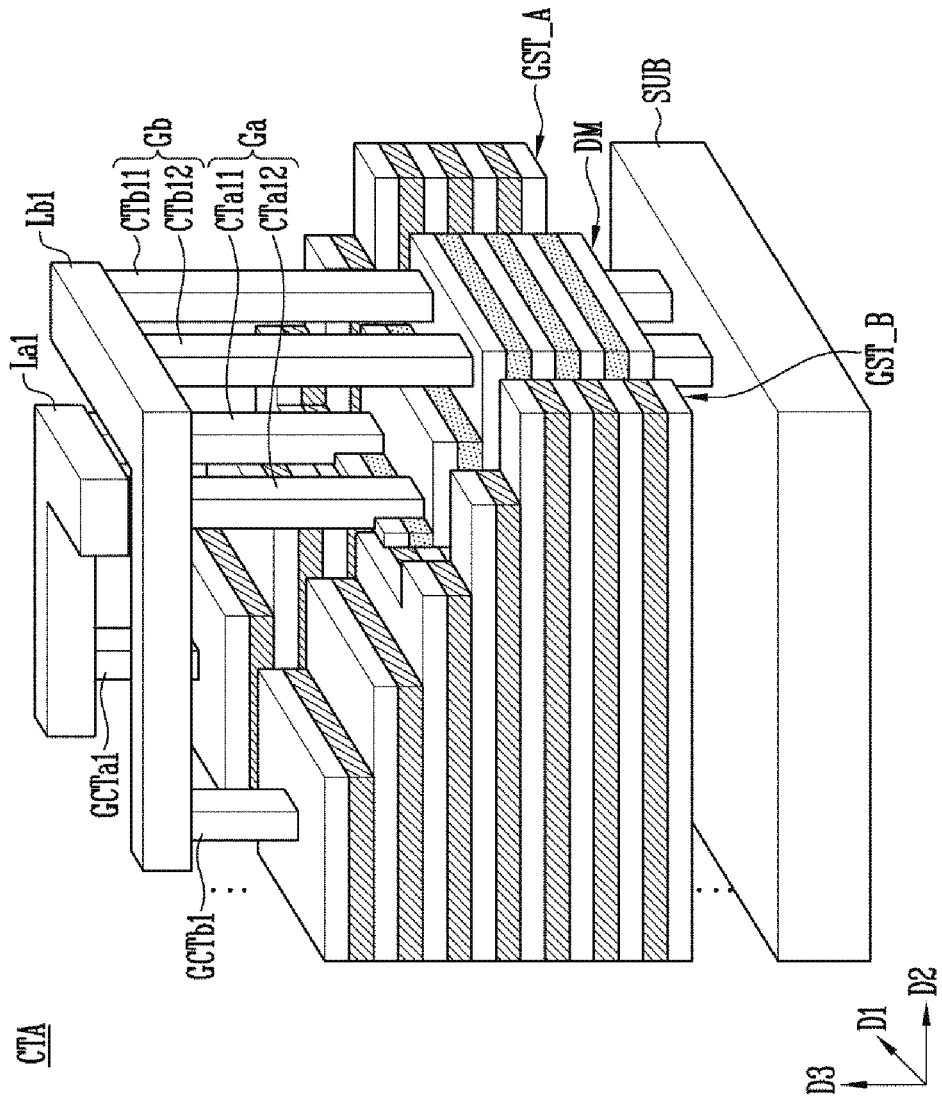
FIG. 6 is a perspective view illustrating a contact area CTA of the semiconductor memory device shown in FIGS. 4A and 4B.

FIG. 6 is a perspective view illustrating the contact area CTA of the semiconductor memory device shown in FIGS. 4A and 4B.

Referring to FIG. 6, in the contact area CTA, the first gate stack GST_A, the second gate stack GST_B, and the dummy stack DM may overlap the substrate SUB including the peripheral circuit 30 described with reference to FIG. 1.

The first contact plugs CTa11 and CTa12 of the first contact group Ga and the second contact plugs CTb11 and CTb12 of the second contact group Gb may be connected to the row decoder 33 of the peripheral circuit 30 described with reference to FIG. 1. The row decoder 33 may be disposed on a portion of the substrate SUB. In an embodiment, the row decoder 33 may be include a plurality of pass transistors. The pass transistors may include junctions defined in the substrate SUB. The junctions are regions defined by injecting at least one of an n-type impurity and a p-type impurity into portions of the substrate SUB. Namely, the substrate SUB may include the junctions for the row decoder 33. In an embodiment, the first contact plugs CTa11 and CTa12 of the first contact group Ga and the second contact plugs CTb11 and CTb12 of the second contact group Gb may be connected to the junctions for the row decoder 33, which are defined in the portions of the substrate SUB. An interconnection structure for connecting the row decoder 33 and the contact plugs CTa11, CTa12, CTb11, and CTb12 to each other may be variously changed according to the design of the semiconductor memory device.

According to an embodiment of the present disclosure, the first contact group Ga and the second contact group Gb overlap different steps of the dummy stack DM. In addition, the first contact plugs CTa11 and CTa12 included in the first contact group Ga and the second contact plugs CTb11 and CTb12 included in the second contact group Gb are arranged in the direction in which the corresponding step extends. In addition, the first contact plugs CTa11 and CTa12 included in the first contact group Ga may be connected to the first gate contact plug GCTa1 through the first upper line La1 corresponding to the first contact plugs CTa11 and CTa12, and the first gate contact plug GCTa1 may be connected to one of the conductive patterns of the first gate stack GST_A. The second contact plugs CTb11 and CTb12 included in the second contact group Gb may be connected to the second gate contact plug GCTb1 through the second upper line Lb1 corresponding to the second contact plugs CTb11 and CTb12, and the second gate contact plug GCTb1 may be connected to one of the conductive patterns of the second gate stack GST_B. According to such a structure, operation reliability of the semiconductor memory device may be secured even though the first contact plugs CTa11 and CTa12 are connected along an extension direction of the corner CN at the boundary of the steps as shown in FIG. 5B by the bridge phenomenon.

FIGS. 7A and 7B are plan views illustrating the semiconductor memory device according to an embodiment. FIG. 7A is a plan view showing a layout of the first and second gate stacks GST_A and GST_B and a dummy stack DM', and FIG. 7B is a plan view illustrating a layout of the bit lines BL and upper lines La1', La2', Lb1', and Lb2'.

Referring to FIGS. 7A and 7B, the semiconductor memory device may include a cell area CA and a contact area CTA'.

The cell area CA is the same as the cell area CA described with reference to FIGS. 4A and 4B. The first gate stack GST_A and the second gate stack GST_B may be formed as the first gate stack GST_A and the second gate stack GST_B described with reference to FIGS. 4A and 4B and FIGS. 5A and 5B.

The plurality of channel structures CH may pass through each of the first gate stack GST_A and the second gate stack GST_B as described with reference to FIG. 4A. Each of the channel structures CH is disposed in the cell area CA. Each of the channel structures CH may be surrounded by the memory film ML as described with reference to FIG. 4A.

The channel structures CH may be connected to the bit lines BL through the bit line contact plugs BCT as described with reference to FIGS. 4A and 4B.

The contact area CTA' is an area in which connection structures are disposed as described with reference to FIGS. 4A and 4B. The connection structures may include the gate contact plugs GCTa1, GCTa2, GCTb1, and GCTb2, the upper line lines La1', La2', Lb1', and Lb2', and the contact plugs CTa1 and CTb1.

The gate contact plugs GCTa1, GCTa2, GCTb1, and GCTb2 may be divided into the first gate contact plugs GCTa1 and GCTa2 connected to the first gate stack GST_A and the second gate contact plugs GCTb1 and GCTb2 connected to the second gate stack GST_B as described with reference to FIG. 4B.

The upper lines La1', La2', Lb1', and Lb2' may be spaced apart from each other. The upper lines La1', La2', Lb1', and Lb2' may be divided into first upper lines La1' and La2' respectively connected to the first gate contact plugs CTa11 and CTa12, and second upper lines Lb1' and Lb2' respectively connected to the second gate contact plugs CTb11 and CTb12. Each of the first upper lines La1' and La2' may be extended to overlap the first gate stack GST_A, the slit SI, and the dummy stack DM'. Each of the second upper lines Lb1' and Lb2' may be extended to overlap the second gate stack GST_B, the slit SI, and the dummy stack DM'.

The dummy stack DM' may overlap the peripheral circuit 30 described with reference to FIG. 2 in the contact area CTA'. The dummy stack DM' may be disposed adjacent to the first gate stack GST_A and the second gate stack GST_B as described with reference to FIGS. 4A and 4B.

The dummy stack DM' may be formed in a stepped structure including a plurality of steps. The dummy stack DM' may be passed through by a plurality of contact plugs overlapping different steps. The contact plugs may be connected to the first and second upper lines La1, La2, Lb1, and Lb2, respectively. The contact plugs may be adjacent to each other in a diagonal direction with respect to the extension direction of the steps, in a plane parallel to the steps. For example, the dummy stack DM' may include steps Sa' to Sc' extending in the first direction D1. The contact plugs may include the first contact plug CTa1 and the second contact plug CTb1 adjacent to each other in a diagonal direction with respect to the first direction D1. The first contact plug CTa1 may overlap a boundary between the step Sa' and the step Sb' adjacent to each other, and the second contact plug CTb1 may overlap the step Sc'. In an embodiment, the second contact plug CTb1 may be spaced apart from sidewalls of the steps Sa' to Sc'.

Each of the above-described first and second contact plugs CTa1 and CTb1 may be connected to corresponding upper line. In the embodiment, the first contact plug CTa1 is connected to the first upper line La1' among the first upper lines La1' and La2', and the second contact plug CTb1 is connected to the second upper line Lb' among the second upper lines Lb1' and Lb2'.

Each of the first gate stack GST_A and the second gate stack GST_B may be formed of the same stack structure as described with reference to FIG. 5A. The dummy stack DM' may be formed of the same stack structure as the dummy stack DM described with reference to FIG. 5B.

Figure 8:
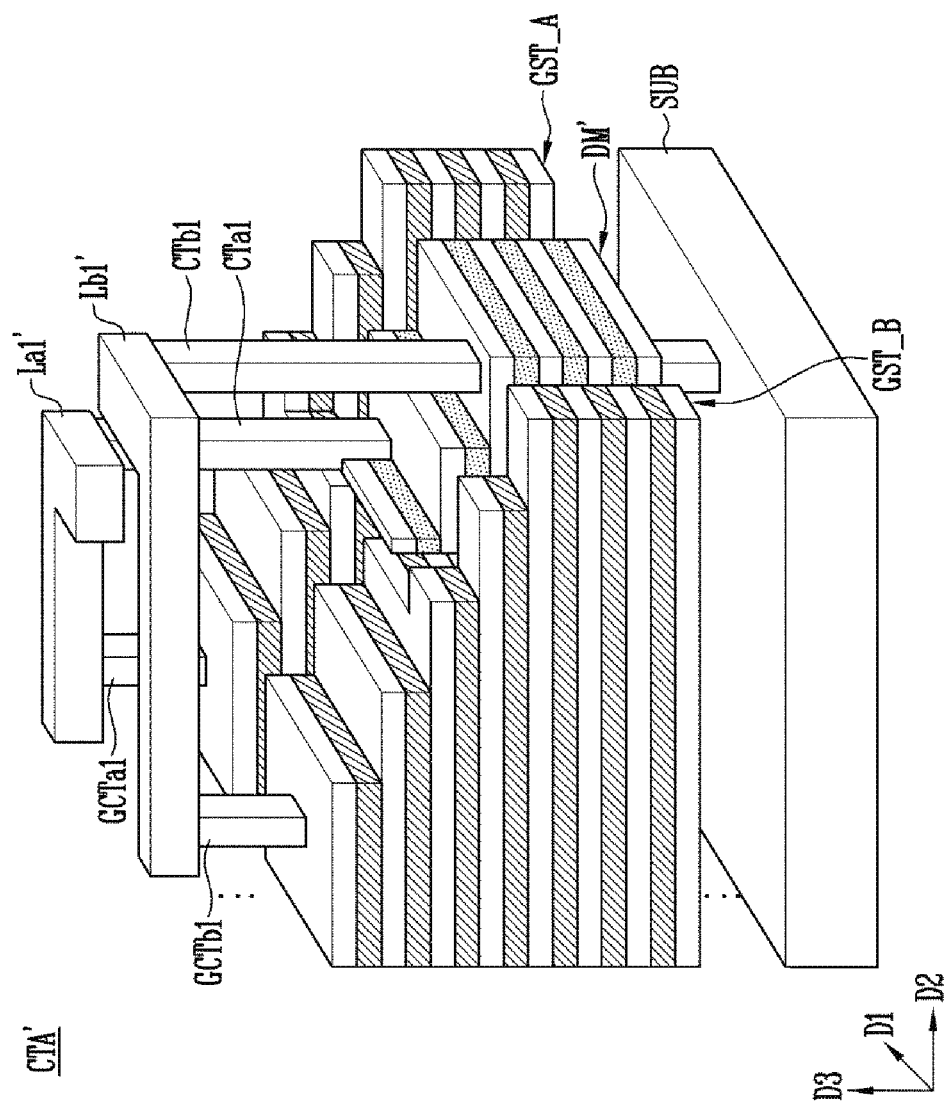
FIG. 8 is a perspective view illustrating a contact area of the semiconductor memory device shown in FIGS. 7A and 7B.

FIG. 8 is a perspective view illustrating a contact area CTA' of the semiconductor memory device shown in FIGS. 7A and 7B.

Referring to FIG. 8, in the contact area CTA', the first gate stack GST_A, the second gate stack GST_B, and the dummy stack DM' may overlap the substrate SUB including the peripheral circuit 30 described with reference to FIG. 1.

The first contact plug CTa1 and the second contact plug CTb1 may be connected to the row decoder 33 of the peripheral circuit 30 described with reference to FIG. 1. The row decoder 33 may be disposed in a portion of the substrate SUB. The interconnection structure for connecting the row decoder 33 and the contact plugs CTa1 and CTb1 to each other may be variously changed according to the design of the semiconductor memory device.

According to an embodiment of the present disclosure, the first upper line La1' and the second upper line Lb1' are respectively connected to the first contact plug CTa1 and the second contact plug CTb1 arranged in a diagonal direction with respect to the extension direction of the steps. According to such a structure, a bridge defect due to the void or the seam generated along an extension direction of the corner at the boundary of the steps may be reduced.

Figure 9:
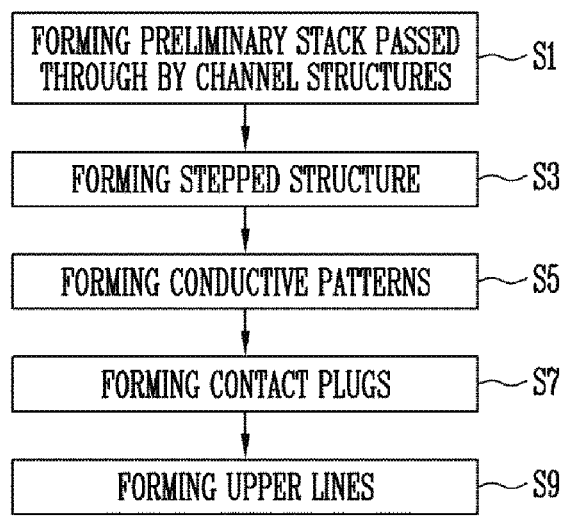
FIG. 9 is a flowchart schematically illustrating a method of manufacturing the semiconductor memory device according to an embodiment.

FIG. 9 is a flowchart schematically illustrating a method of manufacturing the semiconductor memory device according to an embodiment.

Referring to FIG. 9, the semiconductor memory device may include a step S1 of forming a preliminary stack passed through by the channel structures, a step S3 of forming the stepped structure, a step S5 of forming the conductive patterns, a step S7 of forming the contact plugs, and a step S9 of forming the upper lines.

FIGS. 10A to 10E are perspective views illustrating the method of manufacturing the semiconductor memory device according to an embodiment. FIGS. 10A to 10E illustrate an embodiment of the method of manufacturing the semiconductor memory device shown in FIGS. 4A and 4B, 5A and 5B, and 6.

Figure 10A:
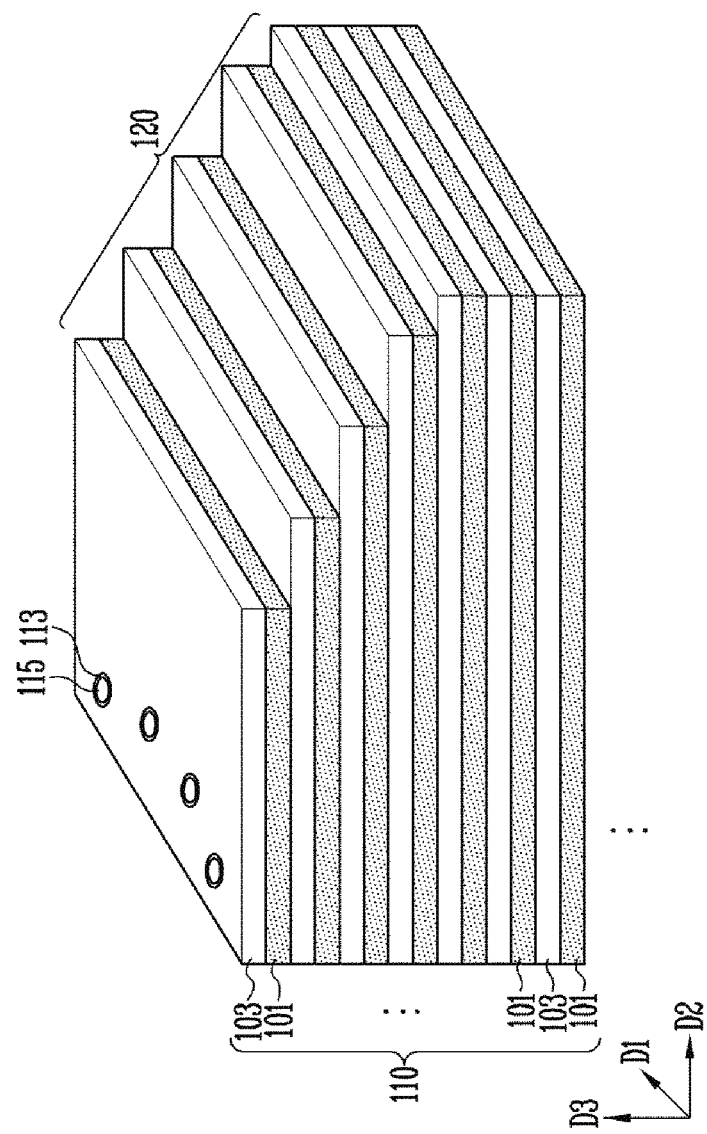

Referring to FIGS. 9 and 10A, the step S1 of forming the preliminary stack 110 passed through by the channel structures 115 may be performed on the substrate SUB after the substrate SUB including the peripheral circuit described with reference to FIG. 6 is provided.

The step S1 of forming the preliminary stack 110 passed through by the channel structures 115 may include a step of forming alternately stacked sacrificial films 101 and interlayer insulating films 103 and a step of forming the channel structure 115 surrounded by a memory film 113.

The sacrificial films 101 and the interlayer insulating films 103 of the preliminary stack 110 may be formed of different materials. For example, the interlayer insulating films 103 may be formed of an oxide such as a silicon oxide film. The sacrificial films 101 may be formed of a material having an etch rate different from that of the interlayer insulating films 103. For example, the sacrificial films 101 may be formed of a nitride such as a silicon nitride film.

The step of forming the channel structure 115 surrounded by the memory film 113 may include a step of forming channel holes passing through the sacrificial films 101 and the interlayer insulating films 103, a step of forming the memory film 113 on sidewalls of each of the channel holes, and a step of filling a center area of each of the channel holes defined by the memory film 113 with the channel structure 115. The memory film 113 may be formed of the same materials as the memory film ML described above with reference to FIG. 5A. Each of the channel structures 115 may be configured of the same materials as the channel structure CH described above with reference to FIG. 5A.

The step S3 of forming the stepped structure 120 may be performed by etching the sacrificial films 101 and the interlayer insulating films 103 so that the stepped structure 120 may be defined by the sacrificial films 101 and the interlayer insulating films 103. Although not shown in the drawing, in an etching process for forming the stepped structure 120, an undercut area may be defined in layers on which the sacrificial films 101 are disposed. The undercut area may extend along the extension direction of the steps of the stepped structure 120, and a void may be formed in the undercut area in a subsequent step. In an embodiment, the steps of the stepped structure 120 may extend in the first direction D1, and the undercut area may be defined in the first direction D1 on each of the layers on which the sacrificial films 101 are disposed.

According to the embodiments described with reference to FIGS. 4A, 4B and 6, an alignment direction of the contact plugs connected to the same upper line is designed in consideration of a direction of the void defined along the undercut area. According to the embodiments described with reference to FIGS. 7A, 7B, and 8, the alignment direction of the contact plugs connected to different upper lines is designed in consideration of the direction of the void defined along the undercut area. Therefore, according to embodiments of the present disclosure, even though the void is generated by the etching process for forming the stepped structure 120, an operation defect of the semiconductor memory device may be improved.

Figure 10B:
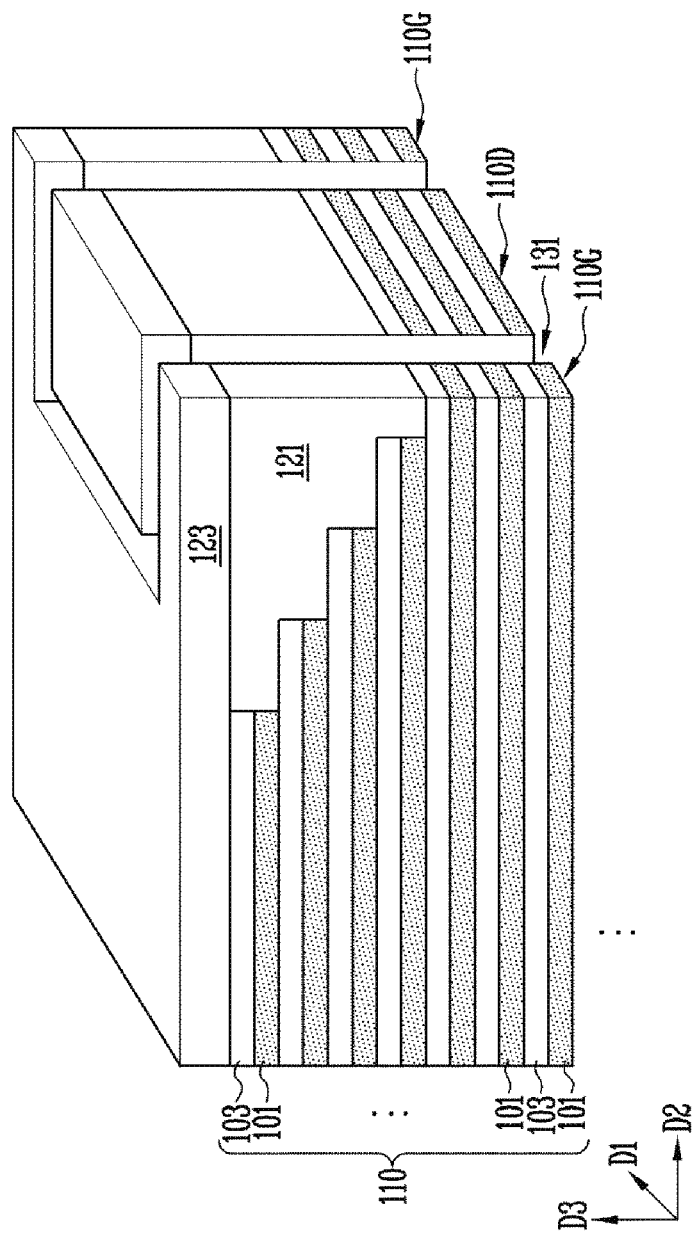

Referring to FIGS. 9 and 10B, before performing the step S5 of forming the conductive patterns, a first slit 131 passing through the preliminary stack 110 may be formed.

A forming of the first slit 131 may include a step of forming of a gap fill insulating film 121, a step of forming a first upper insulating film 123 on the gap fill insulating film 121, and a step of etching the first upper insulating film 123, the gap fill insulating film 121, and the preliminary stack 110.

The gap fill insulating film 121 may alleviate a step difference due to a stepped structure 120 shown in FIG. 10A. The first upper insulating film 123 may be extended to cover the channel structures 115 shown in FIG. 10A.

The preliminary stack 110 may be divided into a preliminary gate stack 110G and a dummy stack 110D by the first slit 131.

Figure 10C:
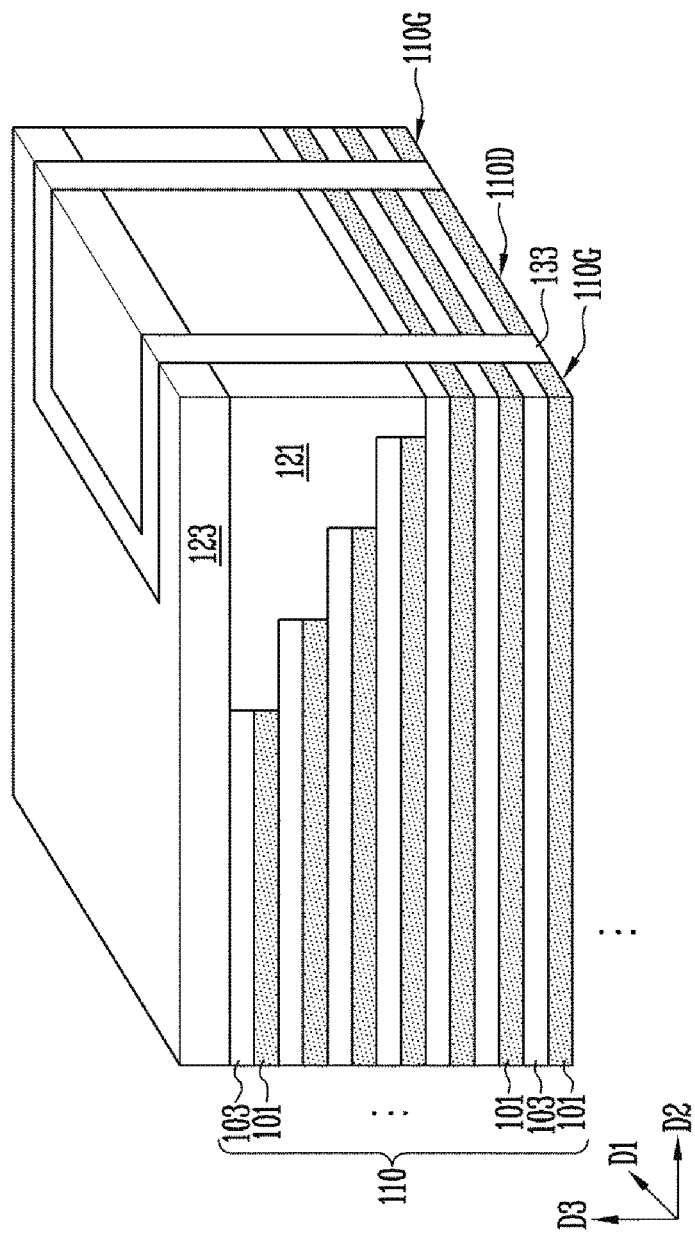

Referring to FIGS. 9 and 10C, before performing the step S5 of forming conductive patterns, the first slit 131 shown in FIG. 10B may be filled with an insulating film 133.

Figure 10D:
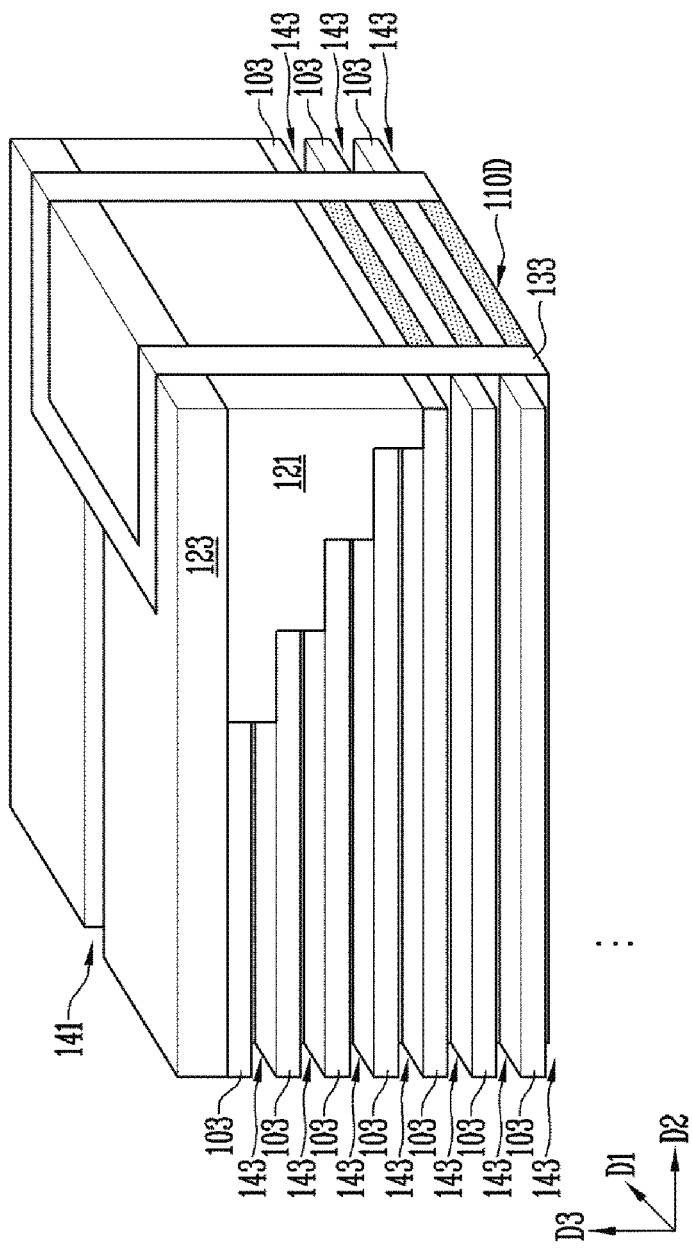

FIGS. 10D and 10E show an embodiment of the step S5 of forming the conductive patterns 145 shown in FIG. 9.

Referring to FIG. 10D, the step S5 of forming the conductive patterns 145 may include a step of forming a second slit 141 passing through the preliminary gate stack 110G shown in FIG. 10C, and a step of removing the sacrificial films 101 shown in FIG. 10C through the second slit 141. Hereinafter, regions in which the sacrificial films 101 are removed are defined as horizontal spaces 143.

The second slit 141 may be connected to the first slit filled with the insulating film 133. During a process of removing the sacrificial films to form the horizontal spaces 143, the insulating film 133 may protect the dummy stack 110D.

Each of the horizontal spaces 143 may be defined between the interlayer insulating films 103 adjacent to each other in the third direction D3.

Referring to FIG. 10E, the step S5 of forming the conductive patterns 145 may include a step of filling each of the horizontal spaces 143 shown in FIG. 10D with a conductive material. Therefore, a first gate stack 110Ga and a second gate stack 110Gb separated from each other by the second slit 141 shown in FIG. 10D and each including the conductive patterns 145 and the interlayer insulating films 103 alternately stacked may be formed.

Subsequently, a second upper insulating film 151 may be formed on the first upper insulating film 123.

Referring to FIGS. 9 and 10E, the step S7 of forming contact plugs passing through at least one of the second upper insulating film 151, the first upper insulating film 123, the gap fill insulating film 121, the interlayer insulating films 103, and the dummy stack 110D may be performed.

FIG. 10E shows contact plugs 153b1 and 153b2 corresponding to the second contact plugs CTb11 and CTb12 shown in FIG. 6, but the gate contact plugs GCTa1 and GCTb1 shown in FIG. 6, and the first contact plugs CTa11 and CTa12 of the first contact group Ga may be further formed in the step S7 of forming the contact plugs.

Referring to FIGS. 9 and 10E, the step S9 of forming the upper lines 155a and 155b on the second upper insulating film 151 may be performed. The upper lines 155a and 155b may include a first upper line 155a and a second upper line 155b connected to the first gate stack 110Ga and the second gate stack 110Gb, respectively.

The semiconductor memory devices shown in FIGS. 7A, 7B, and 8 may be formed using processes described with reference to FIGS. 10A to 10E.

Figure 11:
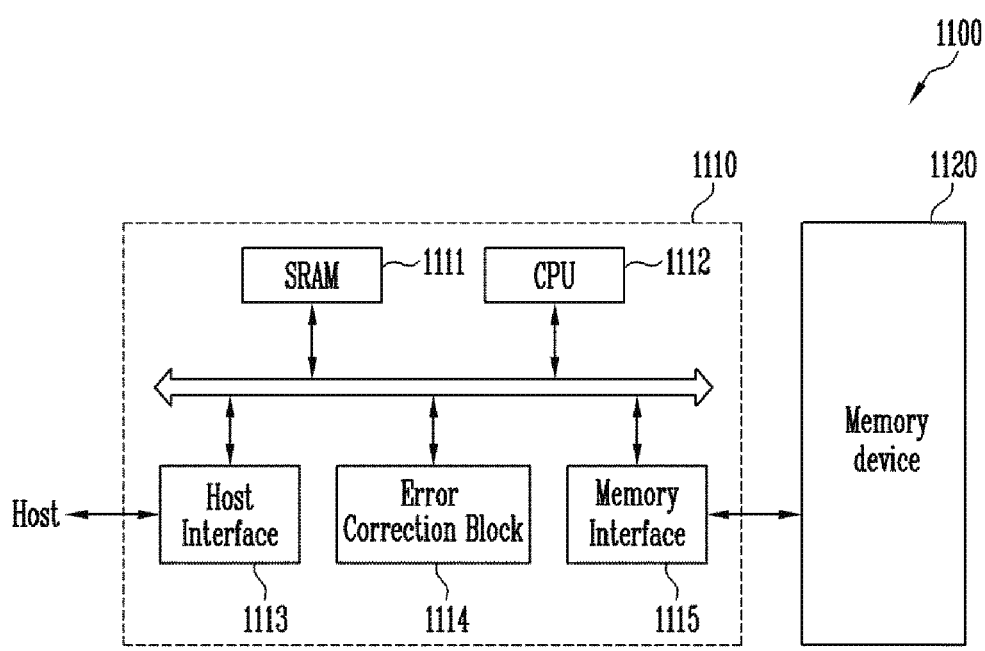
FIG. 11 is a block diagram illustrating a configuration of a memory system according to an embodiment.

FIG. 11 is a block diagram illustrating a configuration of a memory system 1100 according to an embodiment.

Referring to FIG. 11, the memory system 1100 includes a memory device 1120 and a memory controller 1110.

The memory device 1120 may be a multi-chip package configured of a plurality of flash memory chips. The memory device 1120 may include a stepped dummy stack disposed on a substrate including a peripheral circuit, contact groups passing through the stepped dummy stack, and upper lines connected to the contact groups, respectively. Each of the contact groups may include one contact plug or two or more contact plugs. The contact groups different from each other may pass through different steps of the stepped dummy stack. When each of the contact groups includes two or more contact plugs, the contact plugs of each of the contact groups may be arranged in a direction in which the corresponding step extends. The contact plugs connected to different upper lines may be adjacent in a diagonal direction with respect to the direction in which the steps extend.

The memory controller 1110 may be configured to control the memory device 1120, and may include a static random access memory (SRAM) 1111, a central processing unit (CPU) 1112, a host interface 1113, and an error correction block 1114, and a memory interface 1115. The SRAM 1111 is used as an operation memory of the CPU 1112, the CPU 1112 performs various control operations for exchanging data of the memory controller 1110, and the host interface 1113 includes a data exchange protocol of a host that is connected to the memory system 1100. The error correction block 1114 detects an error included in data read from the memory device 1120 and corrects the detected error. The memory interface 1115 performs an interfacing with the memory device 1120. The memory controller 1110 may further include a read only memory (ROM) or the like for storing code data for interfacing with the host.

The memory system 1100 described above may be a memory card or a solid state drive (SSD) in which the memory device 1120 and the memory controller 1110 are combined to each other. For example, when the memory system 1100 is an SSD, the memory controller 1110 may communicate with the outside (for example, a host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and integrated drive electronics (IDE).

Figure 12:
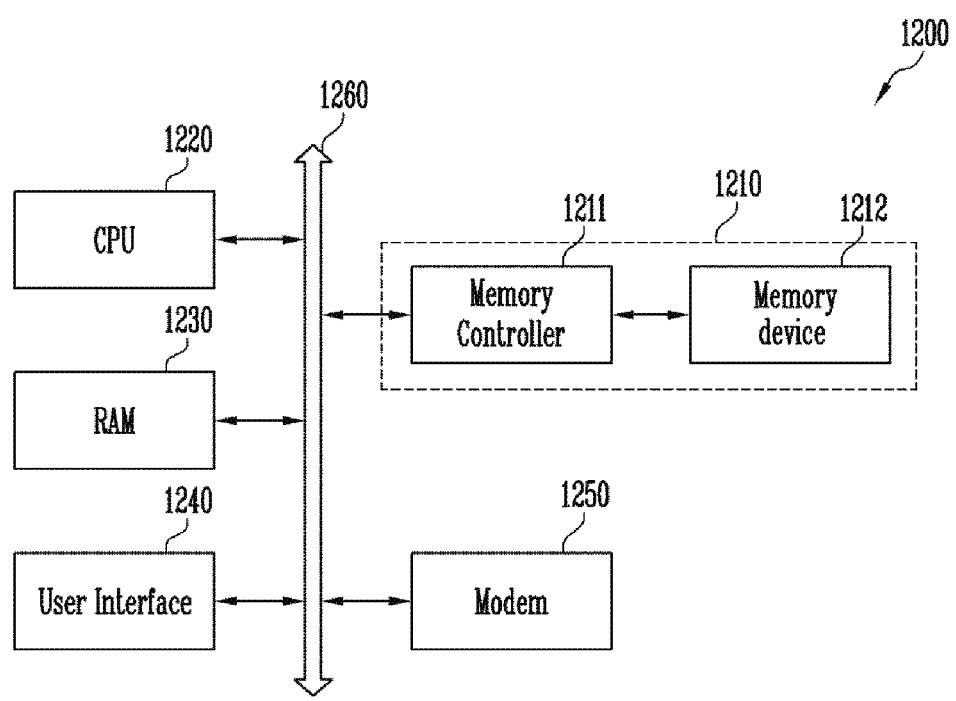
FIG. 12 is a block diagram illustrating a configuration of a computing system according to an embodiment.

FIG. 12 is a block diagram illustrating a configuration of a computing system 1200 according to an embodiment.

Referring to FIG. 12, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chipset, an image processor, a mobile DRAM, and the like may be further included.

The memory system 1210 may be configured of a memory device 1212 and a memory controller 1211. The memory device 1212 may be configured identically to the memory device 1120 described above with reference to FIG. 11. The memory controller 1211 may be configured identically to the memory controller 1100 described above with reference to FIG. 11.

Embodiments of the present disclosure connects the contact plugs arranged in a direction, in which the stepped structure step extends, to the same upper line, or arranges the contact plugs so that the contact plugs respectively connected to different upper lines arrange in a direction different from the direction in which the step extends. Therefore, the embodiments of the present disclosure may reduce a bridge defect due to a void or a seam generated in the contact plug in a process of manufacturing the semiconductor memory device. Thus, the embodiments of the present disclosure present may improve yield reduction of the semiconductor memory device due to a process defect.

What is claimed is:

1. A semiconductor memory device comprising:
   a substrate including a peripheral circuit;
   a stepped dummy stack overlapping the substrate and including a plurality of steps;
   a plurality of contact groups passing through the stepped dummy stack; and
   upper lines respectively connected to the contact groups,
   wherein the contact groups include a first contact group having two or more first contact plugs, and
   the upper lines include a first upper line commonly connected to the two or more first contact plugs, the two or more first contact plugs arranged in an extending direction of a corner defined at a boundary between adjacent steps among the steps.

2. The semiconductor memory device of claim 1, wherein the first contact plugs pass through the corner.

3. The semiconductor memory device of claim 1, further comprising:
   a gate stack disposed on the substrate and including interlayer insulating films and conductive patterns that surround a channel structure and are alternately stacked; and
   a gate contact plug connecting any one of the conductive patterns to the first upper line.

4. The semiconductor memory device of claim 1, wherein the contact groups include a second contact group having two or more second contact plugs arranged in the extending direction of the corner, and
   the upper lines further include a second upper line commonly connected to the second contact plugs.

5. The semiconductor memory device of claim 4, wherein the second contact plugs are spaced apart from sidewalls of the steps.

6. The semiconductor memory device of claim 4, further comprising:
   A gate stack disposed on the substrate and including interlayer insulating films and conductive patterns that surround a channel structure and are alternately stacked; and
   a gate contact plug connecting any one of the conductive patterns to the second upper line.

7. The semiconductor memory device of claim 4,
   wherein the plurality of steps comprises, sequentially, a first step, a second step, and a third step,
   wherein the first contact plugs of the first contact group overlap a boundary between the first and second steps adjacent to each other, and
   wherein the second contact plugs of the second contact group overlap the third step.

8. The semiconductor memory device of claim 4, further comprising:
   a first gate stack disposed on the substrate and including first interlayer insulating films and first conductive patterns that surround a first channel structure and are alternately stacked;
   a first gate contact plug connecting any one of the first conductive patterns to the first upper line;

a second gate stack disposed on the substrate and including second interlayer insulating films and second conductive patterns that surround a second channel structure and are alternately stacked;

a second gate contact plug connecting any one of the second conductive patterns to the second upper line; and a slit separating the first gate stack and the second gate stack, wherein the stepped dummy stack comprises oxide films and nitride films alternately stacked on the substrate and the oxide films and the nitride films of the stepped dummy stack are separated from the first and second gate stacks by the slit.

9. The semiconductor memory device of claim 8, wherein the stepped dummy stack is located between the first and second gate stacks.

10. The semiconductor memory device of claim 1, wherein the stepped dummy stack includes oxide films and nitride films alternately stacked on the substrate.

11. A semiconductor memory device comprising:

a substrate including a peripheral circuit;

a stepped dummy stack overlapping the substrate and including a plurality of steps extending in a first direction;

a first contact plug and a second contact plug that pass through the stepped dummy stack and are adjacent to each other in a diagonal direction with respect to the first direction, in a plane parallel to the steps;

a first upper line connected to the first contact plug; and a second upper line connected to the second contact plug and spaced apart from the first upper line, wherein the first contact plug and the second contact plug are connected to the peripheral circuit.

12. The semiconductor memory device of claim 11, wherein the first contact plug and the second contact plug pass through steps of the plurality of steps, and the steps are different from each other.

13. The semiconductor memory device of claim 11, further comprising:

a first gate stack disposed on the substrate and including interlayer insulating films and conductive patterns that surround a channel structure and are alternately stacked; and a first gate contact plug connecting any one of the conductive patterns to the first upper line.

14. The semiconductor memory device of claim 13, further comprising:

a second gate stack disposed on the substrate and including interlayer insulating films and conductive patterns that surround a channel structure and are alternately stacked; and a second gate contact plug connecting any one of the conductive patterns to the second upper line.

15. The semiconductor memory device of claim 11, wherein the stepped dummy stack includes oxide films and nitride films alternately stacked on the substrate.

16. A semiconductor memory device comprising:

a substrate including a peripheral circuit;

a first gate stack overlapping the substrate;

a second gate stack overlapping the substrate and substantially parallel to the first gate stack;

a stepped dummy stack disposed between the first gate stack and the second gate stack and including a plurality of steps extending in a first direction;

a plurality of contact groups overlapping steps of the plurality of steps that are different from each other, and extending to pass through the stepped dummy stack;

a first gate contact plug connected to the first gate stack;

a second gate contact plug connected to the second gate stack;

a first upper line connecting a first contact group among the contact groups and the first gate contact plug to each other; and a second upper line connecting a second contact group among the contact groups and the second gate contact plug to each other.

17. The semiconductor memory device of claim 16, wherein the first contact group includes two or more first contact plugs arranged in the first direction and commonly connected to the first upper line.

18. The semiconductor memory device of claim 16, wherein the second contact group includes two or more second contact plugs arranged in the first direction and commonly connected to the second upper line.

19. The semiconductor memory device of claim 16, wherein the first contact group and the second contact group are adjacent to each other in a diagonal direction with respect to the first direction, in a plane parallel to the steps.

20. The semiconductor memory device of claim 16, wherein each of the first gate stack and the second gate stack is disposed on the substrate, surrounds a channel structure, and includes interlayer insulating films and conductive patterns alternately stacked.

21. The semiconductor memory device of claim 16, wherein the stepped dummy stack includes oxide films and nitride films alternately stacked on the substrate.

* * * * *